(12) United States Patent
Tonietto

(10) Patent No.: US 6,331,792 B1
(45) Date of Patent: Dec. 18, 2001

(54) CIRCUIT AND METHOD FOR UNLIMITED RANGE FREQUENCY ACQUISITION

(75) Inventor: David Tonietto, Laguna Niguel, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/609,569

(22) Filed: Jun. 30, 2000

(51) Int. Cl.$^7$ ................................ G01R 23/02
(52) U.S. Cl. ............................ 327/48; 327/49
(58) Field of Search ................ 327/39, 40, 41, 327/42, 43–46, 47–49, 145, 150, 160

(56) References Cited

U.S. PATENT DOCUMENTS

| | | | |
|---|---|---|---|
| 5,027,085 | 6/1991 | DeVito | 331/1 A |
| 6,081,572 | * 6/2000 | Filip | 375/376 |
| 6,130,552 | * 10/2000 | Jefferson et al. | 326/39 |

OTHER PUBLICATIONS

T.H. Toifl and P. Moreira, "Simple frequency detector circuit for biphase and NRZ clock recovery,"Electronic Letters, Oct. 1, 1998, vol. 34, No. 20, pp. 1922–1923.
Pottbacker and Langmann, "A Si Bipolar Phase and Frequency Detector IC for Clock Extraction up to 8 Gb/s," IEEE Journal of Solid–State Circuits, vol. 27, No. 12, December 1992, pp. 1747–1751.
Lawrence M. DeVito, "A Versatile Clock Recovery Architecture and Monolithis Implementation," unknown publication, pp. 405–420.

Lawrence DeVito, et al., "A 52MHz Clock–Recovery PLL," 1991 IEEE Internatinal Solid–State Circuits Conference, pp. 142–143, 306.

* cited by examiner

Primary Examiner—Toan Tran
Assistant Examiner—Cassandra Cox
(74) Attorney, Agent, or Firm—Seed IP Law Group PLLC; Michael J. Donohue

(57) ABSTRACT

An improved frequency detector circuit and method is disclosed for frequency acquisition. The frequency detector is particularly useful as part of a frequency loop in a standard two loop clock and data recovery (CDR) circuit because, for among other reasons, the frequency detector is not limited in frequency range. Typically a CDR circuit includes a phase loop and a frequency loop. The frequency loop includes an improved frequency detector which can be simplified as having two parts; a frequency too low detector (FTLD) and a dynamic leakage circuit (DLC). The FTLD monitors the incoming NRZ data and the VCO frequency looking for a rising edge of the VCO between two edges of the data. In one embodiment, the FTLD includes one or more flip-flops to detect the rise and fall of the data and to count the data and clock edges. The DLC is essentially a too high detector and includes a double edge sampler. The DLC monitors the beat frequency between the incoming NRZ data and the VCO. The frequency loop including an improved frequency detector of the present invention effectively changes the VCO frequency to within a small difference of the incoming NRZ data frequency without limitations on the range of effective frequency detection. Upon detection of the center frequency, the frequency loop is shut off and the phase loop is engaged to clean up the NRZ data and lock the phase.

9 Claims, 3 Drawing Sheets

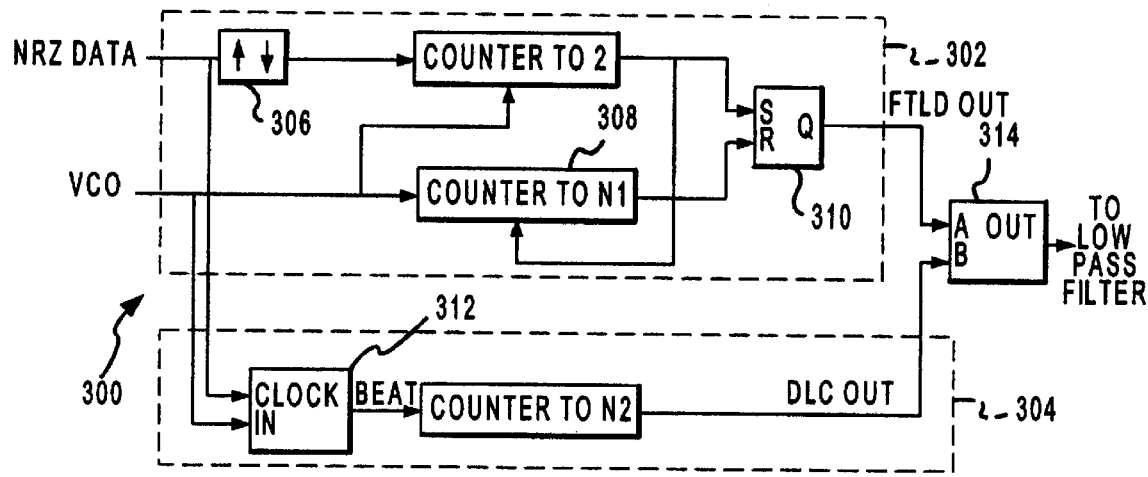
FIG.3
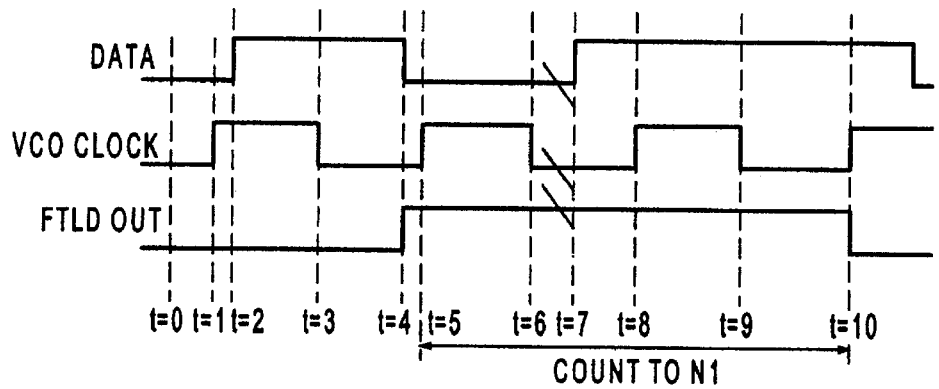
FIG.4
| FTLD (A) | DLC (B) | OUT |
|---|---|---|
| 0 | 0 | 0 |
| 1 | 1 | 1 |
| 1 | 0 | 1 |
| 0 | 1 | -1 |
FIG.6

FIG.5A BEAT FREQUENCY
FIG.5B DLC OUTPUT
FIG.5C MUX OUTPUT
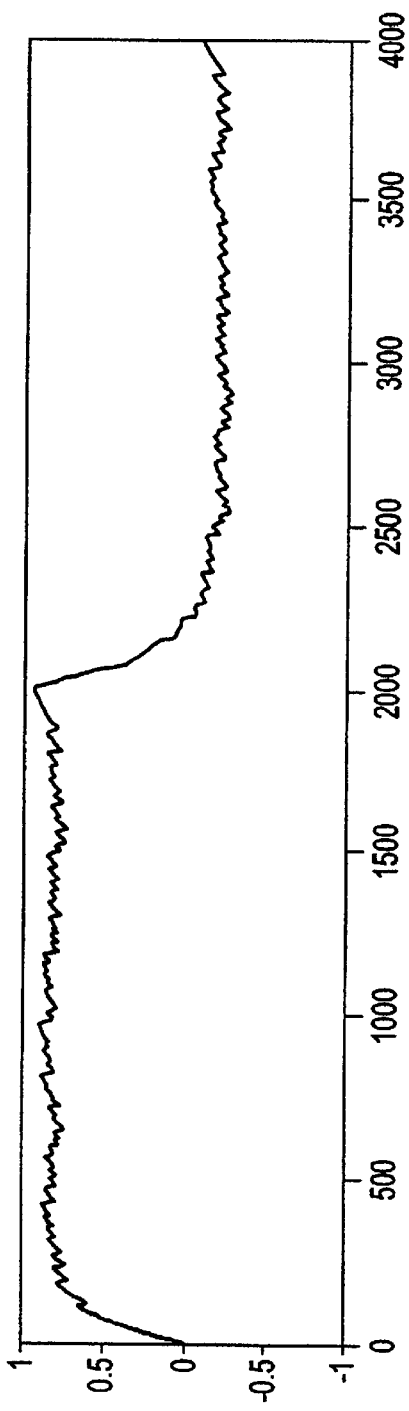
FIG.7

CIRCUIT AND METHOD FOR UNLIMITED RANGE FREQUENCY ACQUISITION

FIELD OF THE INVENTION

The present invention relates generally to an improved circuit and method for frequency acquisition and, more particularly, to a frequency detector circuit and method for unlimited range frequency acquisition.

BACKGROUND OF THE INVENTION

Generally, all communication systems include a transmitter, a receiver and a communication channel. A fiber optic communication system is a lightwave system employing optical fibers as the communication medium. Optical fibers transport the optical signal (lightwave) with relatively little power loss. Power or fiber loss is largely due in part to noise or jitter in the signal. Signal noise can be caused by many different sources, such as, for example, thermal noise, shot noise and imperfect fiber.

Power loss consideration is an important design parameter. In particular, the power loss determines the spacing of repeaters in a long-haul lightwave system. During normal signal transmission it is necessary to periodically regenerate the optical signal with a repeater. Repeater stations include an optical receiver-transmitter pair that detects the incoming optical signal, recovers the electrical bit stream, and converts it back to an optical bit stream by modulating the transmitter. The optical receiver portion typically consists of a digital optical receiver. The digital optical receiver includes a clock and data recovery (CDR) component comprising a decision circuit and a clock recovery circuit. First the decision circuit compares the output from the channel to a threshold level at a sampling time determined by the clock-recovery circuit. Next, the decision circuit decides whether the signal corresponds to bit "1" or bit "0."

The purpose of the clock-recovery circuit is to isolate a spectral component at a frequency (f) equal to the bit rate (B) from the received signal. This component provides information about the bit slot to the decision circuit and helps to synchronize the decision process. In the case of RZ (return-to-zero) format, a spectral component at f=B is present in the received signal and a narrow bandpass filter such as a surface-acoustic-wave (SAW) filter can isolate this component easily. Clock recovery is more difficult in the case of NRZ (non-return-to-zero) format because the received signal lacks a spectral component at f=B. NRZ is the standard data format in SONET (synchronous optical network) systems and SONET is the standard for the telecommunications industry.

The CDR circuit restores and retimes the NRZ bit sequence by extracting the clock signal from the received data. Because the spectrum of a NRZ random bit sequence does not have a spectral component at the bit rate f=B, the component has to be created using nonlinear signal processing. The component at f=B is generated, filtered and phase aligned to the NRZ data to yield a clock signal. In general, a phase and frequency locked loop (PFLL) is used to perform both the filtering and the phase alignment. The incoming data is resampled with a clean clock to filter, for example, jitter present on the data.

The clean clock is provided by a voltage controlled oscillator (VCO). Typically, the frequency and phase of the NRZ data controls the input voltage to the VCO in a loop configuration. The VCO frequency is adjusted in response to the input NRZ data frequency and phase. Ideally, the VCO free running frequency (i.e., without control from the loop) should be as close as possible to the frequency of the incoming data. However, in an integrated CDR, the VCO free running frequency can vary considerably from the data frequency, e.g., up to ±50% difference. In fact, the data frequency may be outside the maximum frequency tuning range of the VCO or outside the maximum range of a conventional frequency detector. In both cases, the limited range of the frequency detector prevents the CDR circuit from adjusting the VCO frequency to the data frequency.

The CDR generally has two loops, a phase loop to clean up and lock the phase, and a frequency loop to adjust the VCO frequency closer to the incoming data frequency. Referring now to FIG. 1, an exemplary schematic of a two loop CDR is shown. As illustrated, CDR 100 comprises a phase loop 102, a frequency loop 104, a VCO 106 and a frequency window 112.

VCO 106 is a standard voltage-controlled oscillator commonly known in the industry including, but not limited to, a ring oscillator or an LC oscillator. One of skill in the art will have familiarity with the design of VCO 106; many such products are readily available on the market.

Frequency window 112 is a counter that monitors the frequencies of loop 104 comparing the frequencies of the beat between the incoming NRZ data and the VCO. Once the frequencies approach an acceptable range, frequency window 112 sends a signal to shut off loop 104, causing a switch coupled to the input of VCO 106 to engage phase loop 102.

Phase loop 102 includes a phase detector 108. Generally, phase detector 108 has a very narrow frequency range and therefore, the VCO frequency must be close to the incoming data frequency for the phase loop to lock.

Because frequency loop 104 has a wider frequency acquisition range than phase loop 102, the frequency loop typically receives the incoming NRZ data when the CDR system is initialized. Frequency loop 104 includes a frequency detector 110. In general, a conventional frequency detector of the prior art has an acquisition range around ±30% if working with no external reference.

A common frequency detector used industry-wide is the Pottbäcker frequency detector. For a complete understanding of the Pottbäcker FD, refer to: A. Pottbäcker, U. Langmann, and H. -U. Schreiber, "An 8 Gb/s Si Bipolar Phase and Frequency Detector IC for Clock Extraction up to 8 Gb/s, "*IEEE J. Solid-State Circuits*, vol. 27, no. 12, pp. 1747–1751, Dec. 1992, the disclosure of which is incorporated herein by reference. The incoming data frequency is compared to the VCO frequency by the Pottbäcker frequency detector. If the incoming data frequency is higher or lower than the VCO frequency, the frequency detector will output an averaged signal to adjust the VCO frequency closer to the data frequency. The change of the VCO frequency continues until the frequency of the VCO nears the incoming data frequency (e.g., typically around ±1% difference).

The frequency acquisition range of a conventional frequency detector 110 is wider than the range of phase detector 108, however the range is still limited. The VCO free running frequency must lie within approximately ±30% of the output of a conventional frequency detector for loop 104 to effectively change the VCO frequency. In operation, however, the difference between the VCO frequency and the bit rate (B) can be as high as ±50%.

Referring now to FIG. 2, an exemplary averaged output signal (e.g. after low pass filter (LPF2) of FIG. 1) of a conventional (e.g., Pottbäcker) frequency detector is shown. For exemplary purposes only, the frequency is varying from zero to twice the incoming data frequency. As we know, NRZ format lacks a spectral component at f=B. As shown in FIG. 2, a change of sign in average occurs at 2000 MHz(e.g., 2.0 GHz) representing the spectral component at f=B. Thus, 2000 MHz is the center frequency or the desired lock point in the exemplary output signal of FIG. 2. Under ideal conditions, the VCO frequency will be the centered frequency and lock at the zero average point.

If the VCO free running frequency is 3000 MHz (below the 0 average), the averaged output of the conventional frequency detector will be set negative and the VCO frequency will be driven lower towards 2000 as expected. On the other hand, if the free running frequency is 1500 (above the 0 average), the averaged output will be set positive and the VCO frequency will be driven higher towards 2000, again as expected. But, if the free running frequency is 1000 the output is set negative and the VCO frequency will be driven lower, away from the desired center frequency (2000). Similarly, at a VCO frequency of 3500 the output is set positive and the VCO frequency will be subsequently increased from 2000. Thus, the conventional frequency detector is susceptible to an unpredictable pattern of increase and decrease. Additionally, the conventional frequency detector is typically capable of modulating the VCO at frequencies around ±30% of the center frequency, but beyond that, the average output is inconsistent. Furthermore, with a conventional frequency detector, the VCO can lock on less dramatic spikes or drops which do not represent the center frequency.

One technique used to address the problem of wide range frequency acquisition includes using an external reference clock having a nominal operating frequency at the desired clock frequency. The frequency detector receives an external reference clock, such as a crystal oscillator, instead of the incoming NRZ data. The VCO frequency is divided and compared with the crystal oscillator frequency.

The external crystal is very precise but allows little room for deviation from the desired frequency. Once the crystal frequency is chosen, the CDR circuit operates only at that bit rate and multiples of that frequency until the crystal is replaced with a different crystal at a different frequency. Thus, for variable-bit rate CDRs, the external crystal lacks the flexibility of multiple frequencies. In fact, to operate a truly variable-bit rate CDR with the external crystal technique requires additional crystals which must be changed thereby increasing the circuit process time and cost.

A second technique includes a post-production trimming of the VCO frequency until the frequency is within the frequency detector's acquisition range. Fuses are burned onto each chip to trim either the bias current of the VCO or the capacitance on the VCO depending upon the architecture of the circuit. Alternatively, each chip can be laser-trimmed by machine but this method increases production costs. Post-production trimming requires careful chip by chip processing making this technique both expensive and time consuming.

Another technique, the disclosure of which is incorporated herein by reference, is disclosed in T. H. Toifl and P. Moreira, "Simple frequency detector circuit for biphase and NRZ clock recovery, "Electronics Letters, vol. 34, no. 20, pp. 1922–23, Oct. 1, 1998. Toifl, et al., discloses a simple frequency detector circuit with unlimited frequency acquisition range, but concedes the frequency detector is unable to detect the frequency if the VCO frequency is too high. This means the frequency acquisition process can only be started at the lowest VCO frequency and gradually increased until the center frequency is detected. In other words, if the VCO frequency is higher than the desired centered frequency, the circuit cannot detect the center frequency and the circuit will not work. Typically, this technique requires post production trimming of the Accordingly, there exists a need for an improved circuit and method for wide range frequency acquisition of NRZ data. In particularly, there is a need for a CDR circuit that is capable of operation when the VCO frequency is lower or higher than the centered frequency. More particularly, there is a need for a frequency detector circuit which is capable of outputting a consistent average beyond ±30% of the center frequency.

SUMMARY OF THE INVENTION

The present invention overcomes the problems of the prior art and provides an improved CDR circuit and method for recovering the clock from NRZ data. In particular, the present invention provides an improved frequency detector especially useful in a CDR circuit. More particularly, the present invention provides an improved CDR circuit and method having unlimited range frequency acquisition.

In an exemplary embodiment, a CDR circuit comprises a conventional two loop architecture having phase and frequency loops. The frequency loop includes an improved frequency detector having a frequency too low detector (FTLD) and a dynamic leakage circuit (DLC). The FTLD includes circuitry to detect the rise and fall edges of the incoming data, count the rising edges of the clock, and generate a pulse when no rising edge of the clock is detected between two edges of the data. The DLC includes circuitry to sample the data pulses and clock pulses and generate a beat frequency. The DLC generates a pulse and the FTLD generates a pulse which are both received in a multiplexer.

The frequency detector is not limited by acquisition range and maintains a consistent averaged output from at least zero to twice the data frequency.

BRIEF DESCRIPTION OF THE DRAWINGS

These and other features, aspects, and advantages of the present invention will become better understood with reference to the following description, appended claims, and accompanying drawings where:

FIG. 3 illustrates an improved frequency detector circuit in accordance with the present invention;

FIG. 4 is a timing diagram illustrating the waveforms produced in the FTLD loop of FIG. 3;

FIG. 5A illustrates the beat frequency between NRZ data and VCO in the DLC loop of FIG. 3;

FIG. 5B illustrates the beat frequency of FIG. 5A after division by N2;

FIG. 5C illustrates the binary output of the MUX of FIG. 3;

FIG. 6 is a binary table illustrating the output of the MUX of FIG. 3; and

FIG. 7 illustrates an exemplary averaged frequency output from a frequency detector in accordance with the present invention as the VCO frequency is swept.

DETAILED DESCRIPTION OF PREFERRED EMBODIMENTS

The present invention relates to an improved circuit and method for frequency acquisition. Although the frequency detector presently disclosed is particularly suited for frequency acquisition and clock recovery from NRZ format data, the uses are not so limited. For example, the frequency detector of the present invention may be useful in any frequency acquisition application. In addition, the present invention is conveniently described with reference to fiber optic communication systems, however, various other systems could benefit from the present disclosure, for example, wireless and xDSL.

The CDR circuit recovers the NRZ data clock, cleans it (eliminates jitter) and retransmits the data to be received by the next regeneration station or end station. One difficulty with recovering NRZ data is that the data is devoid of frequency at the desired bit rate (f=B). The average of the output of a conventional frequency detector working without an external reference has a drop from positive to negative at a frequency corresponding to the bit rate. Unfortunately, outside a limited range of ±30% from the bit rate frequency, the average can change sign (polarity) unpredictably, causing the CDR having a conventional frequency detector to false lock.

Figure 1:
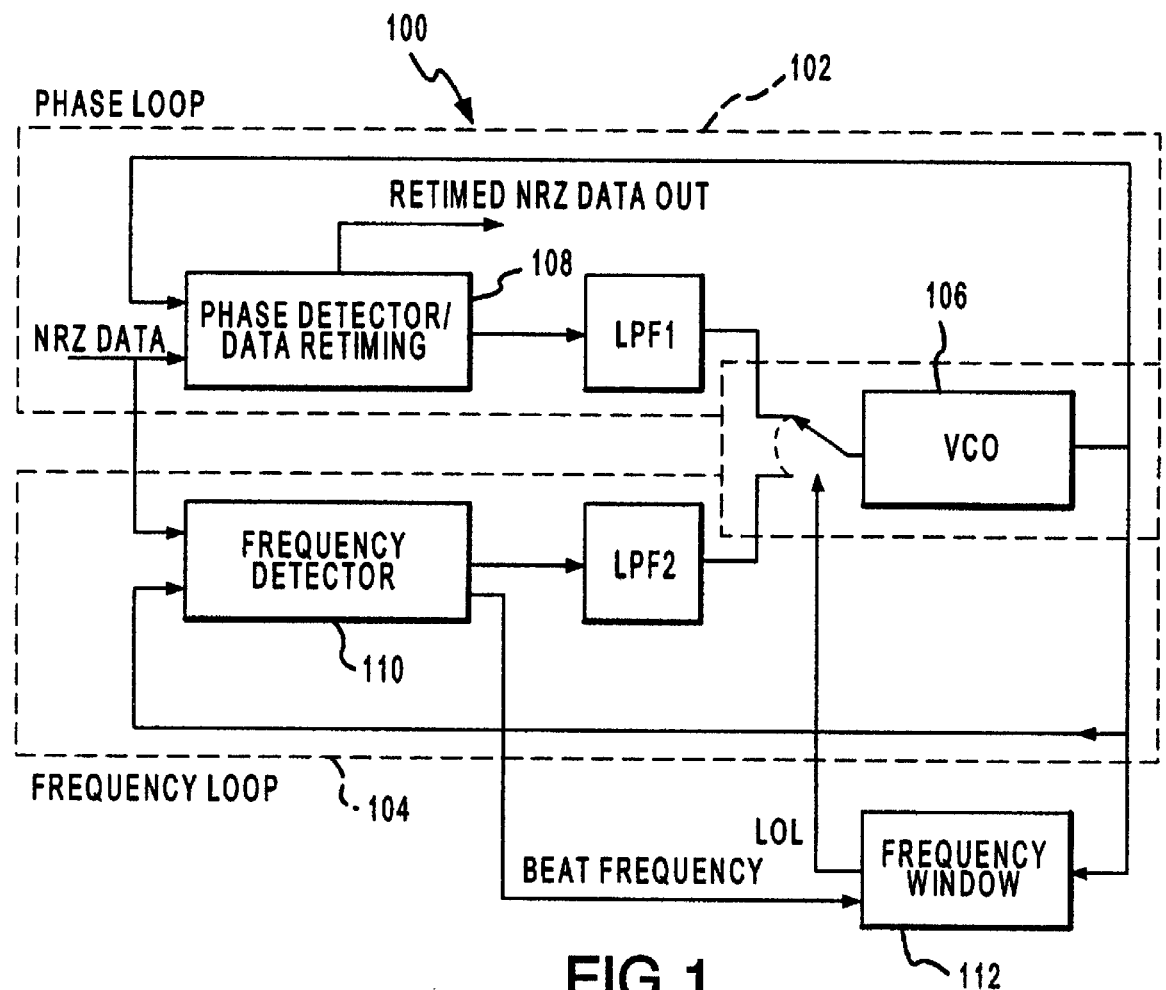
FIG. 1 illustrates in block format a two loop schematic of a conventional CDR of the prior art.

Referring now to FIG. 3, an exemplary unlimited range frequency detector circuit in accordance with the present invention is shown. Frequency detector 300 includes a frequency too low detector (FTLD) 302 and a dynamic leakage circuit (DLC) 304. Frequency detector 300 can suitably operate in the two loop CDR circuit diagram of FIG. 1 as frequency detector 110. Frequency detector 300, when placed in a frequency loop, e.g., loop 104, is suitably configured to drive the frequency of VCO 106 to within a small difference (e.g., typically within ±1%) of the incoming data frequency and is not limited by the range of VCO free running frequencies.

FTLD 302 includes a rise and fall edge detector 306, a counter to 2, a counter to N1 308, and an edge triggered set reset a flip-flop 310. Rise and fall edge detector 306 and counter to 2 may be a single circuit component or group of components such as two or more flip-flops. However, for ease of understanding the present invention, the circuit description is separated by function. For example, NRZ data may be supplied to a pair of flip-flops where one operates on the rising edge of the data and one operates on the falling edge. In addition, the counter to 2 (which may be the same component(s) as the rise and fall edge detector) counts the rising edge of the VCO pulses. If between the two edges of the rise and fall of the data there is not a rising edge of the VCO, the counter to 2 suitably generates a pulse. This event indicates that the clock pulse (VCO) is slower than the incoming data pulse. The generated pulse is received at, for example, a set/reset flip-flop 310 which sets flip-flop 310 high, (to 1) where it remains until reset.

Counter to N1 308 is similarly a component or group of components such as, for example, flip-flops. The pulse generated from counter to 2, which indicates, for example, that a rising edge of the VCO pulse was not detected between two edges of data, resets counter to N1 308. Counter to N1 308 counts the rising edges of VCO clocks. While N1 can be set to any number of clocks, the present inventors have found that 20–100 clocks provides an adequate length of pulses, thus an adequate average and adequate gain of the FTLD. After the predetermined number of clock cycles of VCO are counted, counter to N1 308 generates a pulse to reset flip-flop 310. In other words, set/reset flip-flop 310 remains high ("1") for the number of clock cycles of the VCO as set by N1. If the same event occurs before the count by N1 is over than counter to N1 308 is reset and starts over from zero without flip-flop 310 being reset. Typically, as N1 increases in number, the gain of FTLD increases. As long as flip-flop 310 remains high, the output of FTLD is high ("1") and when flip-flop 310 is reset, the output switches low ("0").

To better understand the operation of FTLD 302, reference is now made to FIG. 4. FIG. 4 is an exemplary timing diagram illustrating the waveforms produced by FTLD 302. At time t=1, the FTLD output is low ("0"). At time t=2, a rising edge of the data is suitably detected in rise and fall edge detector 306 and is counted in counter to 2, however the output of FTLD remains low. At time t=3, a falling edge of the clock arrives at the counter to N1 308, but counter to 2 is unaffected because a rising edge of the VCO has not yet been detected. The falling edge of the data is detected at time t=4. This triggers counter to 2 to generate a pulse setting the edge triggered flip-flop 310 high which results in a high output from FTLD (switching to "1"). In other words, FTLD detected the rising edge of data at time t=2 and the falling edge of data at time t=4 but did not detect a rising edge of the VCO clock in between. Thus, counter to 2 generates a pulse setting the FTLD output high and resetting counter to N1 308.

At time t=5, the next rising edge of the clock arrives at counter to N1 308 which starts the counter counting the number of clock cycles again. The rising edge of the clock also resets counter to 2 to begin counting the data edges again. At time t=6, the next falling edge of the data arrives at counter to N1 308 and is counted. The next rising edge of data arrives at time t=7 and is counted in counter to 2. From time t=4 to t=10, the FTLD output remains high because counter to N1 is still counting. Finally, at time t=10 the FTLD goes low because counter to N1 308 counted the predetermined number of clock cycles thus the counter generated a pulse which reset flip-flop 310.

Referring again to FIG. 3, frequency detector 300 further includes a dynamic leakage circuit (DLC) 304. DLC includes a double edge sampler 312 and a counter to N2. Double edge sampler 312 uses the input NRZ data to sample the VCO. The beat frequency, or difference between the input data and the VCO, is divided by counter to N2. N2 can be set to any number but preferably N2 is less than N1. The present inventors have found that setting N2 around 10–20 provides sufficient accuracy and in contrast to N1, as the number of N2 increases, the gain of DLC decreases.

If the difference between the VCO frequency and the data frequency is high (e.g., the frequencies are far away from each other), the beat frequency will be high and DLC 304 will generate frequent pulses. DLC 304 continues to generate frequent pulses ("1s") as long as the beat frequency remains high. When the difference between the VCO and data frequencies is small, the pulses virtually stop (i.e., DLC goes to "0"). In other words, the farther away the VCO and data frequencies are from each other, the more pulses DLC 304 will generate. As the two frequencies near each other, the pulses gradually lessen, until finally the frequencies are close enough that no pulse is generated.

Referring now to FIG. 5A, the beat frequency from zero to twice the center frequency is illustrated as pulses. In the illustrated embodiment, the center or desired frequency is 2000. As shown, the beat frequency around 2000 and each multiple of 2000 (e.g., 4000) is sparse or nonexistent. This is because the difference between the data and VCO frequencies or "beat" is small near the center frequency. When the beat is small, there is no pulse generated by the DLC. As the beat (difference in frequencies) increases, the DLC output pulses density increases. Some areas in FIG. 5A appear solid which indicates that the pulses are numerous and close together (e.g., when the beat frequency is high).

FIG. 5B illustrates the output of the beat frequency from zero to twice the center frequency after divided by N2. As disclosed previously, N2 can be suitably chosen as specified by each application. For example, in one embodiment N2 is between 10 and 20 clocks.

Referring back to FIG. 3, the outputs of FTLD 302 and DLC 304 are received in multiplexer (MUX) 314. Exemplary MUX 314 is a tri-state or three level output and its design is trivial.

FIGS. 5C and 6 illustrate the output of MUX 314. With combined reference to FIG. 3, FTLD 302 output is shown as "A" and DLC 304 output is shown as "B." If both outputs A and B are "0" the output of MUX 314 will be low or "0." This case occurs when no data signal is being received at circuit 300 or alternatively if the circuit has locked on the center frequency. When FTLD 302 is high (i.e., A=1) and DLC 304 is high (i.e., B=1), MUX 314 output is also high. Both outputs are high ("1") when, for example, the VCO frequency and data frequency are away from each other. For example, FTLD 302 may be high when the clock (VCO) pulse rate is slower than the input data pulse rate, and DLC 304 may be high when the beat frequency is greater than a predetermined threshold. When FTLD 302 is high and DLC 304 is low (i.e., A=1 and B=0), MUX 314 output remains high. This indicates that FTLD 302 has a stronger gain than DLC 304 and may occur when the clock frequency is lower than the input data rate. Finally, when FTLD 302 is low and DLC 304 is high(i.e., A=0 and B=1), MUX 314 goes to "−1." This event may occur when the VCO pulse rate is faster than the input data rate.

Referring again to FIGS. 1 and 3, the output of MUX 314 is averaged by, for example, a low pass filter, generally shown as LPF2. When FTLD 302 output is high ("1"), MUX 314 output is also high and the frequency of the VCO is increased. Alternatively, when the FTLD 302 is low ("0"), the VCO pulse rate is faster than the data pulse rate, or there is no input data signal being received, or the circuit is locked on the center frequency. At this time, the output of DLC 304 determines the state of MUX 314.

In general, among other things, FTLD 302 indicates whether the clock pulse is too slow or too fast and the output of FTLD typically dominates the output of MUX 314. Thus, in an exemplary embodiment, as long as FTLD 302 output is positive, the clock frequency may be increased. DLC 304, among other things, indicates if the beat frequency (difference in frequency between the clock and the input data) is great or small. DLC 304 may have a positive output both when the clock pulse is faster or slower than the input data pulse because DLC is monitoring the absolute value of the average. In general, DLC 304 may act as a "frequency-puller" which opposes the output of FTLD 302 and reduces the clock frequency when the beat frequency is great and the output of FTLD is low.

Referring now to FIG. 7, the averaged output of the frequency detector of the present invention from zero to twice the data frequency is illustrated. The frequency detector suitably changes the VCO frequency to within an acceptable range for the phase detector loop (e.g., loop 102 of FIG. 1) to lock on the center frequency. As illustrated, the frequency detector of the present invention can suitably locate the center frequency to within approximately 1000 ppm of the locking point.

Figure 2:
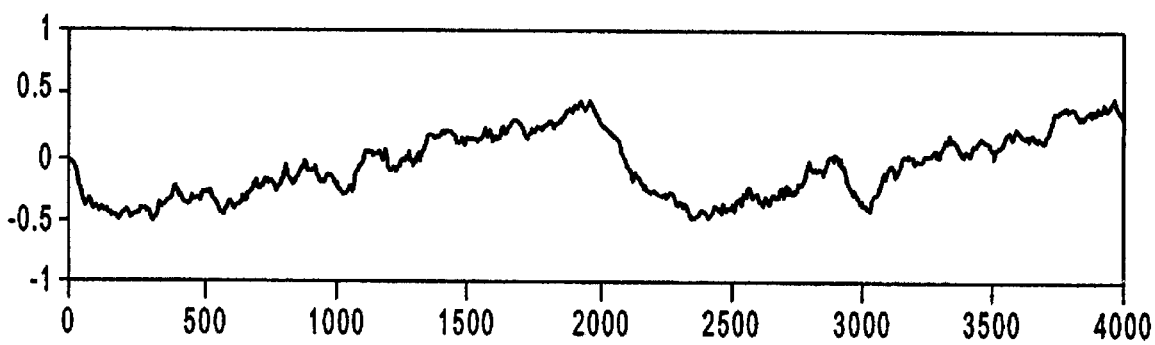
FIG. 2 illustrates an averaged frequency output from a conventional frequency detector of the prior art as the VCO frequency is swept.

Combined reference should now be made to FIGS. 2 and 7 for a comparison of the averaged outputs of the prior art frequency detector and the unlimited range frequency detector in accordance with the present invention. The output shown in FIG. 2 is consistent around ±30% of the center frequency, while FIG. 7, the output of the present invention, is consistent from at least zero to twice the center frequency. In other words, the averaged outputs of the present invention do not fluctuate above and below the zero line which can lead to "false lock" of the CDR circuit.

Referring again to FIG. 1, frequency loop 104, having an unlimited range frequency detector of the present invention inserted as frequency detector 110, is switched off at VCO 106 when the center frequency has been detected. Phase loop 102 is then switched on. Phase loop 102, having a very limited acquisition range, is now suitably able to lock on the NRZ data phase, clean up the jitter and retransmit the signal.

It should be appreciated that the particular implementations shown and described herein are illustrative of the invention and its best mode and are not intended to otherwise limit the scope of the present invention in any way.

The present invention has been described above with reference to preferred embodiments. However, those skilled in the art having read this disclosure will recognize that changes and modifications may be made to the preferred embodiments without departing from the scope of the present invention. These and other changes are intended to be included within the scope of the present invention, as expressed in the following claims.

What is claimed is:

1. A frequency detector circuit comprising:
   a frequency too low detector (FTLD) configured to receive an incoming data pulse and a clock pulse, said incoming data pulse having a center frequency, said FTLD configured to detect and count the rise and fall edges of said incoming data pulse and the rising edges of said clock pulse, said FTLD further configured to generate a bit pulse, said bit pulse set high when said clock pulse has a slower rate than said incoming data pulse;
   a dynamic leakage circuit (DLC) configured to sample said clock pulse with said incoming data pulse, to determine a beat frequency, and to generate a bit pulse, said bit pulse set high when said beat frequency is greater than a predetermined threshold; and
   a multiplexer (MUX) configured to receive said bit pulses from said FTLD and said DLC, said MUX programmed to output a bit indicating the status of said clock pulse in relation to said incoming data pulse.

2. The frequency detector of claim 1, wherein said FTLD receives said incoming data pulse at a pair of flip-flops where one flip-flop operates on the rising edge of said data pulse and the other flip-flop operates on the falling edge of said data pulse.

3. The frequency detector of claim 1, wherein said FTLD comprises two counters configured to count the rising edges of said clock pulse.

4. The frequency detector of claim 3, wherein a first of said counters generates a reset pulse after a predetermined number of rising edges of said clock pulse have been counted.

5. The frequency detector of claim 4, wherein a second of said counters generates a pulse if no rising edge of said clock pulse is counted between the rise and fall edges of said incoming data pulse.

6. The frequency detector of claim 5, wherein said bit pulse from said FTLD is generated by a set/reset flip-flop which is reset by said second counter pulse.

7. The frequency detector of claim 1, wherein said DLC comprises at least one flip-flop.

8. The frequency detector of claim 1, wherein said DLC is configured to divide said beat frequency by a predetermined amount.

9. The frequency detector of claim 1, wherein said incoming data pulse comprises NRZ (non-return-to-zero) data.

* * * * *